(12) United States Patent
Kim et al.

(10) Patent No.: US 6,307,400 B1
(45) Date of Patent: Oct. 23, 2001

(54) DATA REGISTER CIRCUIT IN MEMORY DEVICE

(75) Inventors: Saeng Hwan Kim; Jun Keun Lee, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/606,774

(22) Filed: Jun. 28, 2000

(30) Foreign Application Priority Data

Jun. 29, 1999 (KR) .................................................. 99-25227

(51) Int. Cl.[7] .............................................. H03K 19/0185
(52) U.S. Cl. .......................... 326/83; 326/57; 395/189.05
(58) Field of Search .......................... 326/83, 86, 56–58; 365/189.05, 230.08

(56) References Cited

U.S. PATENT DOCUMENTS

| | | | |
|---|---|---|---|
| 5,867,453 | * | 2/1999 | Wang et al. ........................... 327/239 |
| 6,208,180 | * | 3/2001 | Fisch et al. ........................... 327/141 |
| 6,239,631 | * | 5/2001 | Fujioka et al. ........................ 327/144 |

* cited by examiner

Primary Examiner—Michael Tokar
Assistant Examiner—Don Phu Le
(74) Attorney, Agent, or Firm—Pillsbury Winthrop LLP

(57) ABSTRACT

A data register circuit, comprising: input means which includes a first input portion and a second input portion, the first input portion being reset by a data reset signal and buffering a data signal from a data line in accordance with a data fetch signal and the second input portion being reset by a data reset signal and buffering a data bar signal from a data bar line in accordance with the data fetch signal; storing means which includes a first flip flop and a second flip flop, the first and second flip flops for respectively receiving output signals of the first and second input portions of the input means and providing inverting signals of the output signals of the first and second input portions until the output signals of the first and second input portions are changed by the data reset signal, a first latch which is connected between the first input portion and the first flip flop and temporarily stores the output signal of the first input portion and a second latch which is connected between the second input portion and the second flip flop and temporarily stores the output signal of the second input portion; and data output means which includes a first output portion for receiving and buffering an output signal of the first flip flop and for providing an output signal through a pull-down terminal by a data output control signal and a second output portion for receiving and buffering an output signal of the second flip flop and for providing it an output signal through a pull-up terminal by the data output control signal.

7 Claims, 2 Drawing Sheets

DATA REGISTER CIRCUIT IN MEMORY DEVICE

BACKGROUND OF THE INVENTION

1. Field of the Invention

This invention relates to a data resister circuit in a memory device, and more particularly to a data register circuit for preventing the malfunction of a memory device by preventing the previously stored data in a register from changing due to noise and frequency increase before reset.

2. Description of the Related Art

FIG. 1 shows a circuit diagram of a data register circuit in a memory device in the prior art. The data register circuit includes a data input portion 10 for receiving data signals, a data storing portion 20 for storing the data signal from the data input portion 10, and a data output portion 30 for providing a data stored in the data storing portion 20.

The input portion 10 includes a first input stage 12 for receiving the data signal DATA transferred through a data line and a second input stage 14 for receiving a data bar signal DATAb transferred through a data bar line. The first input stage 12 includes PMOS transistors P1 and P2 and a NMOS transistor N1. The PMOS transistors P1 and P2 are connected between a power supply Vcc and an output node Nd1 of the first input stage 12 in series and are activated by a data fetch signal DATA_FETCH and the data signal DATA from the data line, respectively. The data fetch signal DATA_FETCH is a command signal for making data into store into a register. The MNMOS transistor N1 is connected between a ground Vss and the output node Nd1 of the first input stage 12 and is activated by a data reset signal DATA_RESET.

The second input stage 14 includes PMOS transistors P3 and P4 and a NMOS transistor N2. The PMOS transistors P3 and P4 are connected between a power supply Vcc and an output node Nd2 of the second input. stage 14 in series and are activated by the data fetch signal DATA_FETCH and the data bar signal DATAb, respectively. The NMOS transistor N2 is connected between the output node Nd2 and the ground Vss and is activated by the data reset signal DATA_RESET.

At initial operation, the data input portion 10 including the first and second input stages 12 and 14 resets the potentials of the output nodes Nd1 and Nd2 at a low state by the data reset signal DATA_RESET. If the data signal is received, the first or second input stage 12 or 14 is activated by the data fetch signal DATA_FETCH of a low state. If the data signal DATA is a low state, the first input stage 12 are activated so that the output node Nd1 of the first input stage 12 becomes at a high state. At this time, the second input stage 14 is not activated and the output node Nd2 of the second input stage 14 becomes at a low state.

If the data signal DATA is a high state, the data bar signal DATAb becomes at a low state and the second input stage 14 is activated so that the output node Nd2 of the second input stage 14 becomes at a high state. At this time, the first input stage 12 is not activated and the output node Nd1 of the first input stage 12 becomes at a low state.

On the other hand, the data storing portion 20 includes a first latch for temporarily storing an output signal Nd1 of the first input stage 12 and a second latch for temporarily an output signal Nd2 of the second input stage 14. The first latch includes inverters INV3 and INV4 which are connected to the output node Nd1 of the first input stage 12 in parallel. The second latch includes inverters INV1 and INV2 which are connected to the output node Nd2 of the second input stage 14 in parallel. The data storing portion 20 further includes a NAND gate NA2 for carrying out logic NAND operation of the output signal Nd2 of the second input stage 14 and an output signal Nd4 of the first latch to generate an output signal to a node Nd6 and a NAND gate NA1 for carrying out logic NAND operation of an output signal Nd3 of the second input latch and the output signal Nd1 of the first input stage 12.

The data output portion 30 includes a first output stage 32 and a second output stage 34 for providing the output signals Nd6 and ND5 from the data storing portion 20 to a pull-up terminal pu and a pull-down terminal pd, respectively in accordance with a data output control signal DATA_out.

The first output stage 32 of the data output portion 30 includes PMOS transistors P5 and P6 which are connected between the power supply Vcc and the pull-down terminal pd in series and activated by the output signal Nd5 of the data storing portion 20 and an inverted signal of the output control signal DATA_out through an inverter IN35, respectively and NMOS transistors N3 and N4 which are connected between the pull-down terminal pd and the ground Vss and activated by the output control signal DATA_out and the output signal Nd2 of the second input stage 14 of the data input portion 10, respectively.

The second output stage 34 of the data output portion 30 includes PMOS transistors P7 and P8 which are connected between the power supply Vcc and the pull-up terminal pu in series and activated by the output signal Nd6 of the data storing portion 20 and the inverted signal of the output control signal DATA_out, respectively and NMOS transistors N5 and N6 which are connected between the pull-up terminal pu and the ground Vss and activated by the output control signal DATA_out and the output signal Nd1 of the first input stage 12 of the data input portion 10, respectively.

The operation of the data register circuit will be described as follows. Before the data signal is received, all the output nodes Nd1 and Nd2 of the first and second input stages 12 and 14 have potentials of low state by the data reset signal DATA_RESET which is a command signal for resetting the data stored in the register.

If the data of low state is received, the output node Nd1 of the first input stage 12 maintains at a high state and the output node Nd2 of the second input stage 14 maintains at a low state by the data fetch signal DATA_FETCH of low state. Accordingly, the output nodes Nd5 and Nd6 of the data storing portion 20 become a low state and a high state, respectively.

If the data output control signal DATA_out becomes a high state, the register circuit outputs a high state signal and a low state signal through the pull-down terminal pd and the pull-up terminal pu, respectively.

However, the data register circuit in a memory device has disadvantage as follows. After data has been stored in a register, if another data is received due to noise or crosstalk, the previous date stored in a register is lost, thereby occurring the malfunction. Besides, there is no time margin to appropriately separate the consecutive two data with the increase of frequency so that the data is lost. In other words, the previous data is completely received in one register and then the present data should be stored in another register. When the frequency is increased, because the consecutive two data do not appropriately separated, the previous data and the present data are concurrently stored into the same register so that the previous data is lost.

The above problem will be described with reference to FIG. 1. When the data signal DATA of low state is received, the data bar signal DATAb of low state is also received due to noise, crosstalk or the increase of frequency, the signal stored in a register is changed and the output signals pu and pd become all low states so that it does not provide the data.

SUMMARY OF THE INVENTION

It is an object of the present invention to provide a data register circuit for preventing the data previously stored in a register from changing due to noise and the increase of frequency, thereby preventing malfunction.

According to an aspect of the present invention, there is provided to a data register circuit, comprising: input means which includes a first input portion and a second input portion, the first input portion being reset by a data reset signal and buffering a data signal from a data line in accordance with a data fetch signal and the second input portion being reset by a data reset signal and buffering a data bar signal from a data bar line in accordance with the data fetch signal; storing means which includes a first flip flop and a second flip flop, the first and second flip flops for respectively receiving output signals of the first and second input portions of the input means and providing inverting signals of the output signals of the first and second input portions until the output signals of the first and second input portions are changed by the data reset signal; a first latch which is connected between the first input portion and the first flip flop and temporarily stores the output signal of the first input portion; and a second latch which is connected between the second input portion and the second flip flop and temporarily stores the output signal of the second input portion; and data output means which includes a first output portion for receiving and buffering an output signal of the first flip flop and for providing it through a pull-down terminal by a data output control signal; and a second output portion for receiving and buffering an output signal of the second flip flop and for providing it through a pull-up terminal by the data output control signal.

According to an embodiment of the present invention, the first input portion of the data input means includes an inverter circuit including PMOS transistors where the data fetch signal and the data signal are applied to gates and a NMOS transistor where the data reset signal is applied to a gate. The second input portion of the data input means includes an inverter circuit including PMOS transistors where the data fetch signal and the data bar signal are applied to gates and a NMOS transistor where the data reset signal is applied to a gate.

The first and second flip flops of the storing means includes two NAND gates, respectively and the first and second latch includes two inverters connected in parallel, respectively.

The first output portion of the output means includes a buffer circuit including PMOS transistors which are activated by the output signal of the first flip flop and an inverting signal of the data output control signal, respectively and NMOS transistors which are activated by the output signal of the first flip flop and the data output control signal, respectively. The second output portion of the output means includes a buffer circuit including PMOS transistors which are activated by the output signal of the second flip flop and the inverting signal of the data output control signal and NMOS transistors which are activated by the output signal of the second flip flop and the data output control signal.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 2:
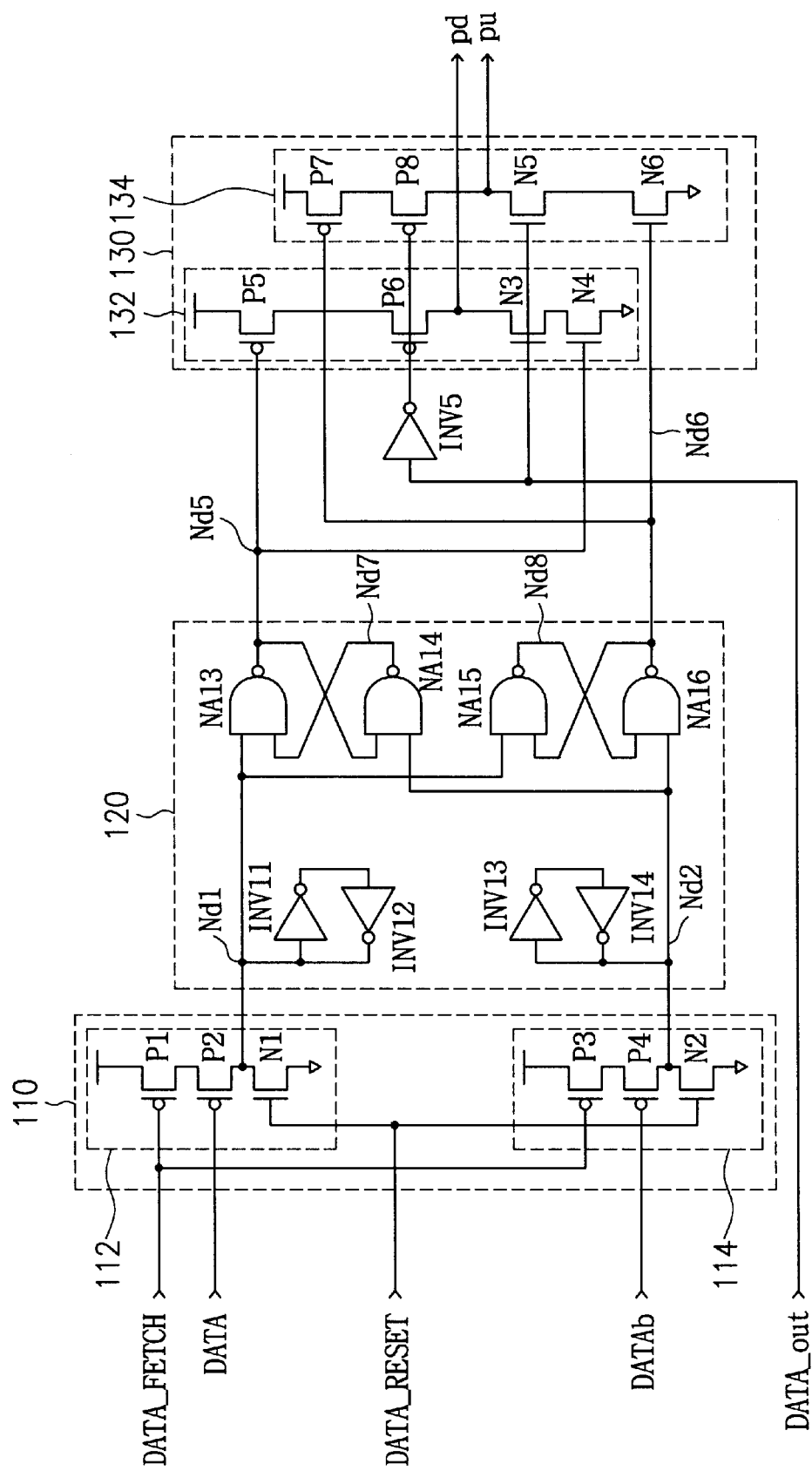
FIG. 2 is a circuit diagram of data register circuit in an embodiment of the present invention.

FIG. 2 is a circuit diagram of a data register circuit in a memory device in accordance with an embodiment of the present invention. The data register circuit includes a data input portion 110 which is reset by a data reset signal DATA_RESET and buffers a data signal DATA and a data bar signal DATAb from a data line and a data bar line, respectively by a data fetch signal DATA_FETCH; a data storing portion 120 which receives output signals from the data input portion 110 and provides previous data signals as output signals until the output signals of the data input portion are changed by the data reset signal DATA_RESET; and a data output portion 130 which buffers the output signals of the data storing portion and providing them as output signals pu and pd.

Figure 1:
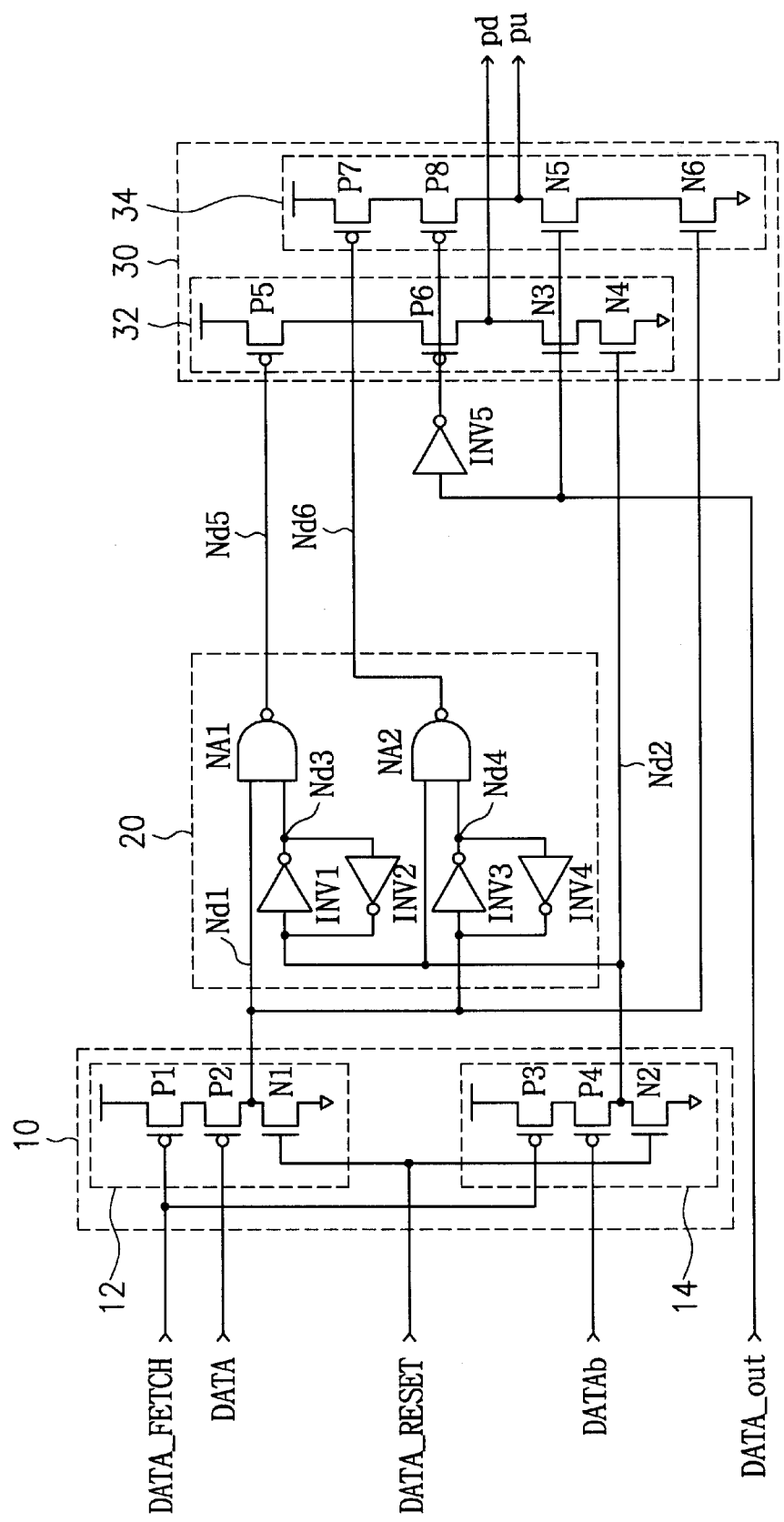
FIG. 1 is a circuit diagram of a data register circuit in the prior art.

The data input portion 110 has the same construction and operation as the data input portion 10 of the prior data register circuit in FIG. 1. The data input portion 110 includes a first data input stage 112 for receiving the data signal DATA from a data line and a second data input stage 114 for receiving the data bar signal DATAb from a data bar line. The data output portion 130 has the same construction and operation as the data output portion 30 of the prior data register circuit 30 in FIG. 1. The data output portion 130 includes a first output stage 132 and a second output stage 134 which provide output signals Nd5 and Nd6 from the data storing portion 120 through a pull-up terminal pu and a pull-down terminal pd by the data output control signal DATA_out.

The first and second input stages 112 and 114 of the data input portion 110 have the same construction and operation as the first and second input stages 12 and 14 of the first input portion 110 of FIG. 1 and the first and second data output stages 132 and 134 of the data output portion 130 have the same construction and the operation as the first and second output stages 32 and 34 of the output portion 30 of FIG. 1.

The data storing portion 120 is embodied to continually latch the data previously received until the data reset signal DATA_RESET. The data storing portion 120 includes a first latch for storing an output signal of a node Nd1 of the first input stage 112 and a second latch for storing an output signal of a node Nd2 of the second input stage 114. The first latch includes inverters INV11 and INV12 connected in parallel to the output node Nd1 and the second latch includes inverters INV13 and INV14 connected in parallel to the output node Nd2.

The data storing portion 120 further includes a first flip flop and a second flip flop. The first flip flop includes NAND gates NA13 and NA14 and the second flip flop includes NAND gates NA15 and NA16. The first flip flop receives the output signals of the nodes Nd1 and Nd2 which are latched through the first and second latches, maintains the output signal of the node Nd1 until the output signal of the node Nd1 in the first input stage 112 is changed by the data reset signal DATA_RESET, and provides an inverting signal of the maintained output signal of the node Nd1 as an output signal through the node Nd5. The second flip flop receives the output signals of the nodes Nd1 and. Nd2 which are latched through the first and second latches, maintains the output signal of the node Nd2 in the second input stage 114 until the output signal of the node Nd2 is changed by the data reset signal DATA_RESET and provides an inverting signal of the maintained output signal of the node Nd2 as an output signal through the node Nd6.

The operation of the data register circuit will be described in detail as follows. Before the data signal DATA and the data bar signal DATAb are received, the nodes Nd1 and Nd2 of the first and second input stages 112 and 114 have potentials of low states by the data reset signal DATA_RESET.

If the data signal DATA and the data bar signal DATAb are received, the data fetch signal DATA_FETCH of a low state which is a command signal for storing the received data signal into a register and the first and second input stages 112 and 114 are activated.

In case where of the data signal DATA of a low state, the data bar signal is at a high state. The output signal of the node Nd1 ill the first input stage 112 becomes a high state and the output signal of the node Nd2 in the second input stage 114 becomes a low state. In case of the data signal DATA of a high state, the data bar signal is at a low state. The output signal of the node Nd1 in the first input stage 112 becomes a low state and the output signal of the node Nd2 in the second input stage 114 becomes a high state.

The output signal of the node Nd1 is latched through the first latch including the inverters INV11 and INV12 and the output signal of the node Nd2 is latched through the second latch including the inverters INV113 and INV114. If the output signals of the nodes Nd1 and Nd2 are at a high state and at a low state respectively, the first flip flop including the NAND gates NA13 and NA14 generates the inverting signal of the output signal of the Node Nd1 through the node Nd5, that is a low state signal.

At this time, although the data bar signal DATAb becomes also low state due to crosstalk, noise or the increase of frequency, the output signal at the node Nd5 of the first flip flop has no change. That is, after the output signal at the node Nd1 is latched through the first latch, although the output signal at the node Nd2 is changed from high state to low state, the first flip flop maintains the output signal of high state at the node Nd1 and generates the output signal of low state through the node Nd5 as it is.

In conclusion, after the data signal DATA of low state and the data bar signal DATAb of high state are received, although they are changed due to crosstalk, noise or the increase of frequency, the flip flop maintains the previously latched data signal until the data reset signal is received.

Similarly, the second latch including inverters INV13 and INV14 and the second flip flop including NAND gates NA15 and NA16 have the same operation as the first latch including inverters INV11 and INV12 and the first flip flop including NAND gates NA13 and NA14.

Accordingly, the potential of the output node Nd5 at the first flip flop becomes a low state and the potential of the output node Nd6 at the second flip flop becomes a high state. The data storing portion 120 provides the output signals of low state and high state to the data output portion 130 through the nodes Nd5 and Nd6, respectively. The data output portion 130 receives the output signal of low state at the node Nd5 through the first output stage 132 and the output signal of high state at the node Nd6 through the second output stage 134, respectively and then provides the output signal of high state through the pull-down terminal pd and the output signal of low state through the pull-up terminal pu, respectively.

According to the present invention, the data register circuit prevent the previously stored data from changing due to noise, crosstalk or the increase of frequency until the data is reset so that the malfunction can be prevented. Therefore, the performance of the semiconductor memory device such as high speed operation and enhancement of the noise immunity and reliability can be improved. While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A data register circuit, comprising: input means which includes a first input portion and a second input portion, the first input portion being reset by a data reset signal and buffering a data signal from a data line in accordance with a data fetch signal and the second input portion being reset by a data reset signal and buffering a data bar signal from a data bar line in accordance with the data fetch signal; storing means which includes a first flip flop and a second flip flop, the first and second flip flops for respectively receiving output signals of the first and second input portions of the input means and providing inverting signals of the output signals of the first and second input portions until the output signals of the first and second input portions are changed by the data reset signal; a first latch which is connected between the first input portion and the first flip flop and temporarily stores the output signal of the first input portion; and a second latch which is connected between the second input portion and the second flip flop and temporarily stores the output signal of the second input portion; and data output means which includes a first output portion for receiving and buffering an output signal of the first flip flop and for providing it through a pull-down terminal by a data output control signal and a second output portion for receiving and buffering an output signal of the second flip flop and for providing it an output signal through a pull-up terminal by the data output control signal.

2. The data register as claimed in claim 1, wherein the first input portion of the data input means includes an inverter circuit including PMOS transistors where the data fetch signal and the data signal are applied to gates and a NMOS transistor where the data reset signal is applied to a gate.

3. The data register as claimed in claim 1, wherein the second input portion of the data input means includes an inverter circuit, including PMOS transistors where the data fetch signal and the data bar signal are applied to gates and a NMOS transistor where the data reset signal is applied to a gate.

4. The data register as claimed in claim 1, wherein the first and second flip flops of the storing means include two NAND gates, respectively.

5. The data register as claimed in claim 1, wherein the first and second latches include two inverters connected in parallel, respectively.

6. The data register as claimed in claim 1, wherein the first output portion of the output means include s a buffer circuit including PMOS transistors which are activated by the output signal of the first flip flop and an inverting signal of the data output control signal, respectively and NMOS transistors which are activated by the output signal of the first flip flop and the data output control signal, respectively.

7. The data register as claimed in claim 1, wherein the second output portion of the output means includes a buffer circuit including PMOS transistors which are activated by the output signal of the second flip flop and the inverting signal of the data output control signal and NMOS transistors which are activated by the output signal of the second flip flop and the data output control signal.

* * * * *